US008355686B2

(12) United States Patent  
De Luca et al.

(10) Patent No.: US 8,355,686 B2
(45) Date of Patent: Jan. 15, 2013

(54) RADIO PRESET KEY ASSIGNMENT METHOD AND APPARATUS

(75) Inventors: Michael J. De Luca, Boca Raton, FL (US); Lee M. Cherubin, Boca Raton, FL (US)

(73) Assignee: Sirius XM Radio Inc., New York, NY (US)

( * ) Notice: Subject to any disclaimer, the term of this patent is extended or adjusted under 35 U.S.C. 154(b) by 1078 days.

(21) Appl. No.: 11/550,493

(22) Filed: Oct. 18, 2006

(65) Prior Publication Data

US 2008/0096502 A1   Apr. 24, 2008

(51) Int. Cl.
H04B 1/18 (2006.01)
(52) U.S. Cl. .................................. 455/184.1; 455/186.2
(58) Field of Classification Search .... 455/166.1–191.1, 455/184.1–185.1, 186.2
See application file for complete search history.

(56) References Cited

U.S. PATENT DOCUMENTS

| | | | |
|---|---|---|---|
| 4,298,851 A | 11/1981 | Shichijo et al. | |
| 4,491,975 A | 1/1985 | Ito | |
| 4,525,866 A | 6/1985 | Templin | |
| 4,833,728 A | 5/1989 | Kimura et al. | |
| 4,870,492 A | 9/1989 | Hakamada et al. | |
| 5,303,400 A | 4/1994 | Mogi | |
| 5,357,285 A | 10/1994 | Sanya et al. | |
| 5,809,427 A * | 9/1998 | Perreault et al. | 455/450 |
| 5,933,192 A | 8/1999 | Crosby et al. | |
| 6,112,063 A | 8/2000 | Ravi et al. | |
| 6,161,002 A | 12/2000 | Migliaccio et al. | |
| 6,188,448 B1 | 2/2001 | Pauley et al. | |
| 6,240,280 B1 | 5/2001 | Ravi et al. | |
| 6,334,217 B1 | 12/2001 | Kim | |
| 6,470,178 B1 | 10/2002 | Cummings-Hill et al. | |
| 6,519,011 B1 | 2/2003 | Shendar | |
| 6,539,210 B1 | 3/2003 | Heredia et al. | |
| 6,804,824 B1 | 10/2004 | Potrebic et al. | |
| 6,927,806 B2 | 8/2005 | Chan | |
| 6,963,725 B2 | 11/2005 | Kato | |
| 7,054,601 B2 * | 5/2006 | Heiderscheit et al. | 455/184.1 |
| 7,756,497 B2 * | 7/2010 | Skeie et al. | 455/185.1 |
| 2004/0171377 A1 | 9/2004 | Engstrom | |
| 2004/0198282 A1 * | 10/2004 | Heiderscheit et al. | 455/186.1 |
| 2005/0020223 A1 | 1/2005 | Ellis et al. | |
| 2005/0159122 A1 | 7/2005 | Mayer | |
| 2006/0046769 A1 | 3/2006 | Arun | |
| 2009/0124193 A1 * | 5/2009 | Mitzel et al. | 455/3.01 |
| 2011/0207423 A1 * | 8/2011 | Tarte | 455/186.1 |

OTHER PUBLICATIONS

International Search Report dated Apr. 3, 2008 for PCT/US07/81507.

* cited by examiner

*Primary Examiner* — Lana N Le
(74) *Attorney, Agent, or Firm* — Kramer Levin Naftalis & Frankel LLP

(57) ABSTRACT

A system and method for assigning received channels to preset tuning keys of a receiver. A series of preset keys are sequentially labeled and one preset key, such as the preset key marked "0," is a pre-defined preset key. An elongated pressing of the pre-defined key causes the currently tuned channel, if it is not assigned to a preset key, to be assigned to an unassigned preset key. If the currently tuned channel is already assigned to a preset key, pressing the pre-defined key instead causes the currently selected channel to be un-assigned from that preset key. Radios with two tuners that each process different sets of radio signals assign channels for a particular tuner to alternating preset keys, allowing acceleration of sequentially selecting channels assigned to pre-set keys by pre-tuning another tuner to the next channel in the sequence.

20 Claims, 3 Drawing Sheets

RADIO PRESET KEY ASSIGNMENT METHOD AND APPARATUS

FIELD OF THE INVENTION

The present invention generally relates to the field of electronics user controls and more particularly to user controls for radio receivers.

BACKGROUND OF THE INVENTION

Electronic devices used to receive broadcast signals, such as audio radios, often facilitate the user's control of the device by providing programmable operator interface keys. In the case of radios, a number of programmable "preset keys" are usually provided that allow a user to assign a particular radio channel to each of the programmable preset keys. These preset keys are especially useful for the use of radios in an automobile where it is desired to minimize a driver's distraction in selecting a different received radio channel. Preset keys are also used in portable radios and in all types of radios due to their general convenience. Once a channel is assigned to a preset key, the user is able to cause the radio to select that channel by simply pressing the preset key to which that channel is assigned. By assigning different channels to each preset key, the user is able to quickly select a number of favorite channels by simply pressing the associated preset key.

Advances in technology allow an increasing number of preset keys to be provided on a single radio. The user interfaces of such radios typically do not display, in a comprehensive or convenient manner, the channels that are assigned to all of the preset keys. A user wishing to determine which channels are assigned to the preset keys is usually required to press each preset key and remember which channels are assigned to each. This becomes increasingly difficult as the number of preset keys increases. Furthermore, radios typically do not indicate which preset keys have channels already assigned. When a user wishes to assign a new channel to a preset key, there is no way to easily confirm which preset keys is not already assigned a channel that is desired by the user and which the user does not wish to overwrite with the new channel. This often requires a user to sequence through all preset keys to determine which preset key can be overwritten with the assignment of the new channel. The user is also not sure, unless the user inspects the setting of all of the preset keys, if the "new" channel is already assigned to a preset key.

New radios signals are digitally modulated and may require a significant amount of time to process the signal. This can result in a delay when a radio's signal processor is changed to another channel. This delay can produce an undesirable gap in the programming presented to the user.

Therefore a need exists to overcome the problems with the prior art as discussed above.

SUMMARY OF THE INVENTION

Briefly, in accordance with one aspect of the present invention a method for assigning radio preset keys includes determining a currently selected channel of a radio and determining a pressing of a pre-defined preset key where the pre-defined preset key is one of a plurality of preset keys. Each preset key within the plurality of preset keys is able to cause the radio to select a respective charmer assigned to that preset key and the respective assigned channel is able to be arbitrarily selected from channels that are selectable by the radio. The method further includes determining that a currently selected channel is not currently assigned to a preset key within the plurality of preset keys. The method also includes assigning, in response to determining the pressing of the pre-defined preset key and in response to determining that the currently selected channel is not currently assigned to a preset key within the plurality of preset keys, the currently selected channel to an available preset key that is different from the pre-defined preset key.

In accordance with another aspect of the present invention, a radio preset key assignment apparatus includes a channel selection processor that is communicatively coupled to a plurality of preset keys. The channel selection processor is adapted to assign each preset key of the plurality of preset keys to a respective assigned channel. Each preset key within the plurality of preset keys is able to cause a radio to select a respective channel assigned to that preset key, where the respective assigned channel is able to be arbitrarily selected from channels that are selectable by the radio. The channel selection processor is further adapted to determine a currently selected channel of the radio. The radio preset key assignment apparatus further includes a preset key assigner that is communicatively coupled to a pre-defined preset key within the plurality of preset keys and is also communicatively coupled to the channel selection processor. The preset key assigner is adapted to determine a pressing of the pre-defined preset key and, in response thereto, assign the currently selected channel to an available preset key that is different from the pre-defined preset key.

DESCRIPTION OF THE FIGURES

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as illustrative examples for the claims and as a representative basis for teaching one skilled in the art to variously employ the present invention in virtually any appropriately detailed structure. Further, the terms and phrases used herein are not intended to be limiting; but rather, to provide an understandable description of embodiments of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Figure 1:
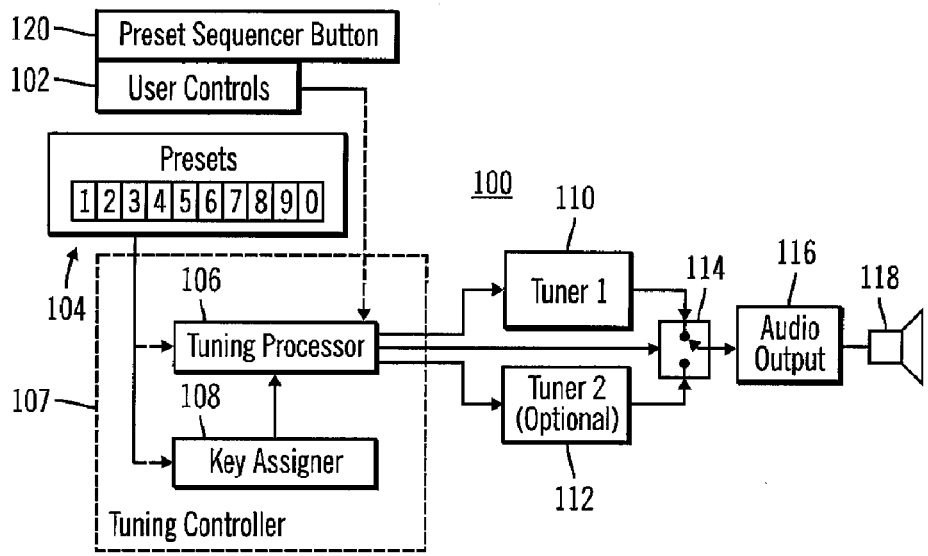
FIG. 1 illustrates a radio processing component interconnection diagram in accordance with one embodiment of the present invention.

FIG. 1 illustrates a radio processing component interconnection diagram 100 in accordance with one embodiment of the present invention. The radio processing component interconnection diagram 100 illustrates a user radio, such as a subscription satellite radio used with Satellite Digital Audio Radio Service (SDARS) that include systems operated by Sirius Satellite Radio, Incorporated, and XM Satellite Radio Holdings, Incorporated. The radio processing component interconnection diagram 100 includes two tuners, a tuner 1 110 and a tuner 2 112. Tuner 2 is an optional feature of the radio processing component interconnection diagram 100 and is used to enhance access to SDARS content, as is described in detail below. Further embodiments of the present invention are able to suitably operate with only one tuner, such as only with tuner 1 110.

The two tuners of the radio processing component interconnection diagram 100 correspond to a first signal processor and a second signal processor. Tuner 1 110 corresponds to a first signal processor that is adapted to process a first set of channels from a first set of radio signals. Tuner 2 112 corresponds to a second signal processor that is adapted to process a second set of channels from a second set of radio signals that are different from the first set of radio signals. In an example, the first set of radio signals correspond to an XM satellite radio network and the second set of radio signals correspond to a Sirius satellite radio network.

Tuner 1 110 and tuner 2 112 provide audio output signals to an audio switch 114. Audio switch 114 is controlled by a tuning processor 106, which is described in further detail below. The audio switch 114 provides a selected audio output to an audio output circuit 116, which includes signal conditioning and other processing circuits as are required for the reproduction of audio output. The audio output circuit 115 provides output to a speaker system 118. Although a single speaker is shown, multiple speakers used to reproduce stereo or other multiple audio channel signals are typically utilized by the radio processing component interconnection diagram 100. Further embodiments of the present invention modulate the output of the audio output circuit 116 onto an FM carrier that is injected into an FM radio for audio reproduction.

The radio processing component interconnection diagram 100 includes a bank of preset keys 104. The bank of preset keys 104 of one embodiment of the present invention includes ten (10) preset keys labeled from "1" through "0." The ten preset keys are arranged in a sequence, which corresponds to the numerical order of the label of each preset key. In one embodiment of the present invention, the preset key with the label "0" is the last, or highest, preset key in the sequence and follows the preset key with the label "9." In this particular embodiment, the "1" preset key is the first, or lowest, preset key in the sequence. In this particular embodiment, the "0" preset key and the "11" preset key are each at one end of the sequence.

One of the preset keys within the bank of preset keys 104 is pre-configured as a pre-defined preset key. The pre-defined preset key is able to be any preset key, but is preferably a preset key that is at one end of the sequence. In one embodiment, the pre-defined preset key is pre-configured to be the preset key labeled with "0." In an alternate embodiment, the pre-defined key may be a separate key which does not function as a preset key.

Each of these preset keys is connected to a tuning processor 106 and a key assigner 108. The tuning processor 106 and key assigner 108 make up a tuning controller 107. The key assigner 108 monitors presses of the preset keys within the bank of preset keys 104. When the key assigner 108 determines an elongated pressing of a pressed preset key other than the pre-defined preset key, the key assigner 108 assigns, in response to that determination, the currently selected channel to the pressed preset key. In addition to determining an elongated pressing of a preset key other than the pre-defined preset key, the key assigner 108 determines a pressing of the pre-defined preset key, determines, through the tuning processor 106, the currently selected channel of the radio and assigns the currently selected channel to an available preset key that is different from the pre-defined preset key. In this context, the currently selected channel of the radio corresponds to the channel being processed to produce audio output through speaker 118.

In one embodiment, the assigning of the currently selected channel to an available preset key that is different from the pre-defined preset key is performed in response to determining an elongated pressing of the pre-defined preset key. In this embodiment, in the event that there is no available preset key that is different from the pre-defined preset key, an elongated pressing of the pre-defined preset key results in the currently selected channel being assigned to the pre-determined preset key. In such embodiments, any short pressing of a preset key, even the pre-defined preset key, as detected by the tuning processor 106 causes the radio to select the channel assigned to the pressed key.

In addition to assigning, in response to determining a pressing of the pre-defined preset key, one embodiment of the present invention further determines if the currently selected channel is assigned to any of the preset keys within the bank of preset keys 104. Such embodiments assign, in response to determining that the currently selected channel is not currently assigned to any of the plurality of preset keys, the currently selected channel to an available preset key that is different from the pre-defined preset key. These embodiments also operate to de-assign, in response to determining that the currently selected channel is currently assigned to a preset key, the currently selected channel from die preset key to which the currently selected channel is currently assigned. In order to facilitate programming of the preset keys, some embodiments of the present invention provide a user interface display element, such as a light or graphical display element, that reflects whether or not the currently selected channel is already assigned to a preset key. As an example, an icon may blink to indicate that the channel is not already assigned to a preset and the icon may stay ON to indicate that the channel is already assigned to a preset.

As discussed above, the radio of one embodiment includes two tuners, tuner 1 110 and tuner 2 112. Each of these two tuners is able to process one of two different radio signals. For example, tuner 1 110 is able to process XM satellite radio signals and tuner 2 112 is able to process Sirius satellite radio signals. As a result, each of the two tuners of this embodiment is able to select and process different channels to produce audio output signals. Tuner 1 110 is able to produce audio output signals for XM satellite radio channels and tuner 2 112 is able to produce audio output signals for Sirius satellite radio channels.

In the above example of a radio with two tuners that each select and process different respective sets of channels, assigning a channel to a particular preset key within the bank of preset keys 104 also results in a corresponding tuner being effectively assigned to that preset key as well. For example, when assigning an XM satellite radio channel to a particular preset key, pressing that preset key causes the tuning processor 106 to cause tuner 1 110, which is able to select XM satellite radio channels, to select the channel assigned to that preset key. In one embodiment, the processing causes the radio to select the channel assigned to a pressed preset key by commanding an appropriate tuner, either tuner 1 110 or tuner 2 112 depending on the service to which the channel belongs, to select the channel assigned to the pressed preset key.

The radio processing component interconnection diagram 100 further includes user controls 102. User controls of one embodiment of the present invention include, for example tuner selection controls, a preset sequencer button 120, and other user controls. The preset sequencer button 120 causes the radio to sequentially select channels assigned to preset keys, as is described below.

Figure 2:
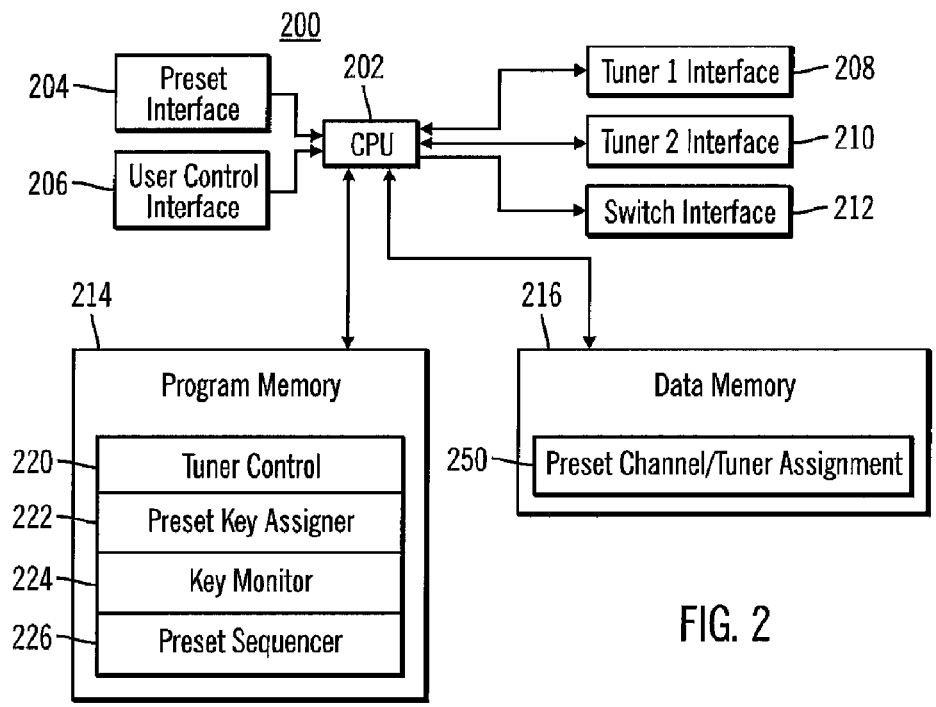
FIG. 2 illustrates a block diagram of a channel selection controller of a radio illustrated in FIG. 1, in accordance with one embodiment of the present invention.

FIG. 2 illustrates a block diagram of a channel selection controller 200 of a radio illustrated in FIG. 1, in accordance with one embodiment of the present invention. The channel selection controller 200 of one embodiment performs the processing described for the tuning controller 107 discussed above. The channel selection controller 200 includes a CPU 202 that accepts inputs from various user input controls and executes programmed processing according to stored programs. The CPU 202 accepts inputs from the bank of preset keys 104 through a preset interface 204. The CPU 202 further accepts user inputs from the user controls 102 through a user control interface 206. The CPU 202 further provides control outputs to tuner 1 110 through a tuner 1 interface 208 and to tuner 2 112 through a tuner 2 interface 210. The CPU 202 also provides control signals to the audio switch 114 through a switch interface 212.

The CPU 202 executes programs stored in program memory 212 that is part of the channel selection controller 200. Program memory 214 includes a tuner control program 220 that includes programming to properly control tuner 1 110 and tuner 2 112. The program memory 214 also includes a preset key assigner 222 that performs the preset key assigner processing described herein. The program memory further includes a key monitor 224, which performs the processing required to monitor the bank of preset keys 104 and determine which preset key has been pressed and for how long that key has been pressed. The program memory 214 further includes a preset sequencer 226, which performs the processing to sequentially select channels assigned to preset keys, as is described below.

The channel selection controller 200 further includes a data memory 250. Data memory 250 of one embodiment of the present invention includes preset channel/tuner assignments for each preset key within the bank of preset keys 104.

Some embodiments of the present invention that incorporate two tuners, as discussed above, operate to assign preset keys within the bank of preset keys 104 such that channels associated with the different tuners are first assigned to alternating preset keys in the sequence of preset keys. As an example, XM satellite channels are first assigned to even numbered preset keys and Sirius satellite channels are first assigned to odd numbered preset keys. By arranging the assignments to preset keys in such a manner, a user is able to sequentially select channels assigned to the preset keys while alternating the tuners that are used to receive each channel in the sequence. By alternating tuners, the processing is able to allow one tuner to produce audio output for the currently selected channel while advantageously pre-tuning the other tuner to the channel of the next preset key in the sequence. Changing the channel to the channel of the next preset key in the sequence therefore only requires changing the selected tuner to produce audio output through the speaker 118, which results in a more rapid channel change given the tuning delays of digital tuners, such as the SDARS tuners incorporated in one embodiment of the present invention. In one embodiment of the present invention, sequential scanning through the channels assigned to the preset keys is facilitated by a preset sequencer button 120, which causes the channel assigned to the next preset key in the sequence to be selected each time the preset sequencer button 120 is pressed.

Figure 3:
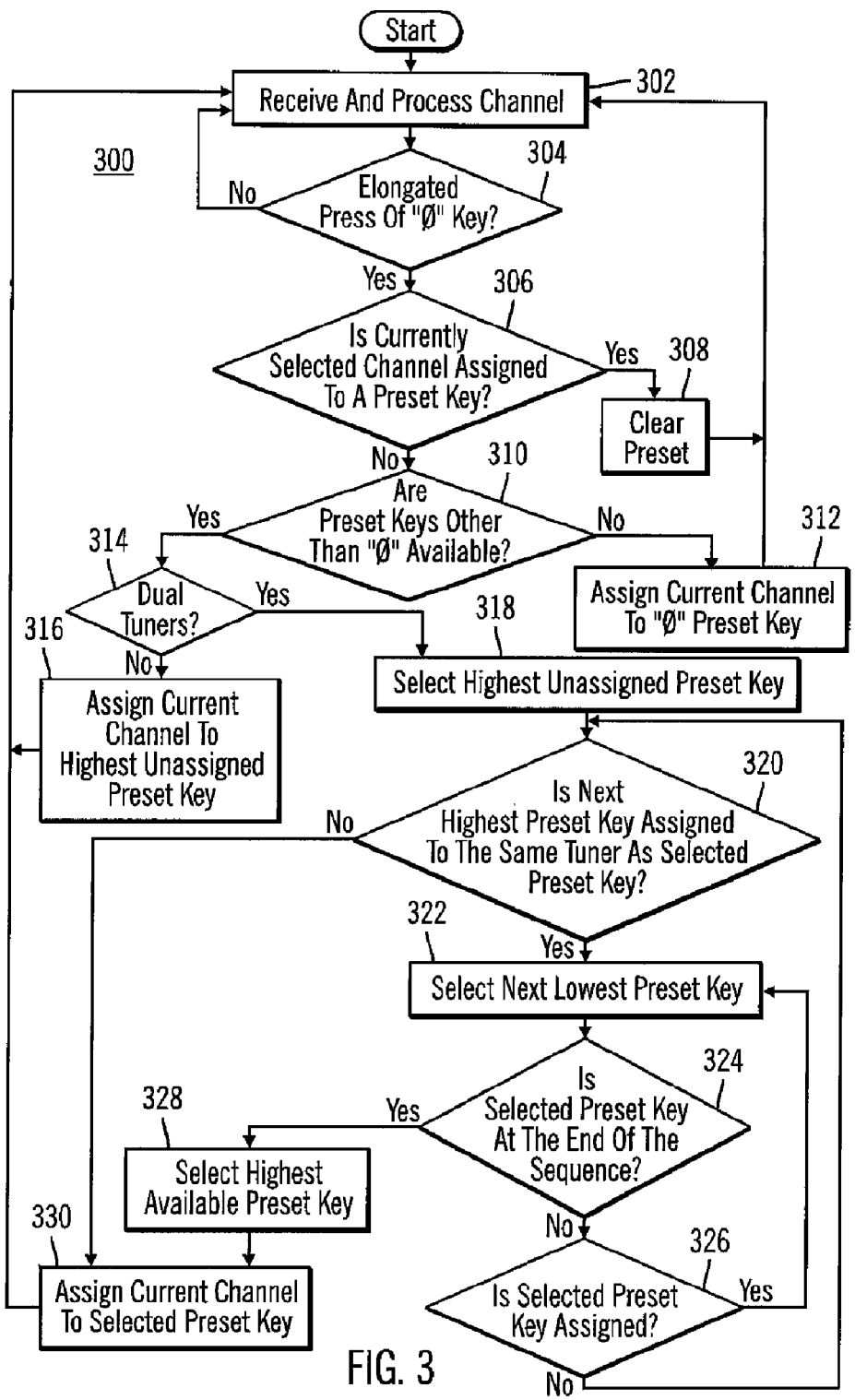
FIG. 3 illustrates a processing flow diagram of an automatic preset key assignment process in accordance with one embodiment of the present invention.

FIG. 3 illustrates a processing flow diagram of an automatic preset key assignment process 300 in accordance with one embodiment of the present invention. The automatic preset key assignment process 300 begins by receiving and processing, at step 302, a channel with one of the tuners, i.e., either tuner 1110 or tuner 2 112, of the radio. The automatic preset key assignment process 300 then determines, as step 304, an elongated press of the "0" preset key within the bank of preset keys, which is the pre-determined preset key in this example. If no elongated press is determined, the processing returns to receiving and processing the currently received channel. If an elongated press of the "0" key was determined, the processing continues by determining, at step 306, if the currently selected channel is assigned to a preset key. If the currently selected channel is assigned to a preset key, the processing clears, at step 308, the preset to which the currently selected channel is assigned by de-assigning the currently selected channel from the preset key to which the currently selected channel is currently assigned.

If the currently selected channel is determined to not be assigned to a preset key, the processing determines, at step 310, if a preset key other than the "0" preset key is available. If it is determined that preset keys other than the "0" preset key are not available, the processing assigns, at step 312, the currently selected channel to the "0" preset key. The processing then returns to receiving and processing, at step 302, the currently assigned channel. Further embodiments of the present invention will first assign the current channel to the "0" preset key if the "0" preset key is unassigned.

If it is determined that at least one preset keys other than the "0" key is available, the processing next determines, at stop 314, if the radio has dual tuners. By having dual tuners, the radio is able to perform specialized processing, such as assigning channels for two tuners to alternating preset keys, that is not available with a radio that has a single tuner. If the radio does not have dual tuners, the processing continues by assigning, at step 316, the currently selected channel to the highest available preset key that is different from the "0" key. The processing then returns to receiving and processing, at step 302, the currently assigned channel.

If it is determined that the radio has dual tuners, the processing continues determining that a candidate preset key exists. One embodiment of the present invention determines if a candidate preset key exists by first selecting, at step 318, the highest unassigned preset key as a currently selected preset key. The processing continues by determining, at step 320, if the next highest preset key, relative to the currently selected preset key, is assigned to the same tuner as the currently selected preset key. In alternative embodiments, this step is able to determine if either or both adjacent keys are assigned to the same tuner. If it is determined that the next highest preset key is not assigned to the same tuner as the currently selected preset key, the currently selected preset key is a candidate preset key and the processing continues by assigning, at step 330, the currently selected channel to the currently selected preset key. The processing then returns to receiving and processing, at step 302, the currently assigned channel.

If the next highest preset key is determined to be assigned to the same timer as the currently selected preset key, the processing continues by selecting, at step 322, the next lowest preset key. The processing continues by determining, at step 324, if the currently selected preset key is at the end of the sequence of preset keys within the bank of preset keys 104. If it is determined that the currently selected preset key is at the end of the sequence, the processing selects, at step 328, the highest available preset key within the sequence of preset keys within the bank of preset keys 104. An available preset key in this context is a preset key which does not have a channel assigned thereto. Further embodiments of the present invention alternatively select, in this case, the lowest preset key in the sequence that has no assigned channel.

If it is determined that the currently selected preset key was not at the end of the sequence, the processing continues by determining, at step 326, if the currently selected preset key is assigned. If the currently selected preset key is assigned, the processing continues by returning to selecting, at step 322, the next lowest preset key, relative to the currently selected preset key, as the currently selected present key. If the currently selected key was not determined to be assigned, the processing returns to determining, at step 320, if the next highest preset key, relative to the currently selected preset key, is assigned to the same tuner as the currently selected preset key, then and continues processing as described above.

Figure 4:
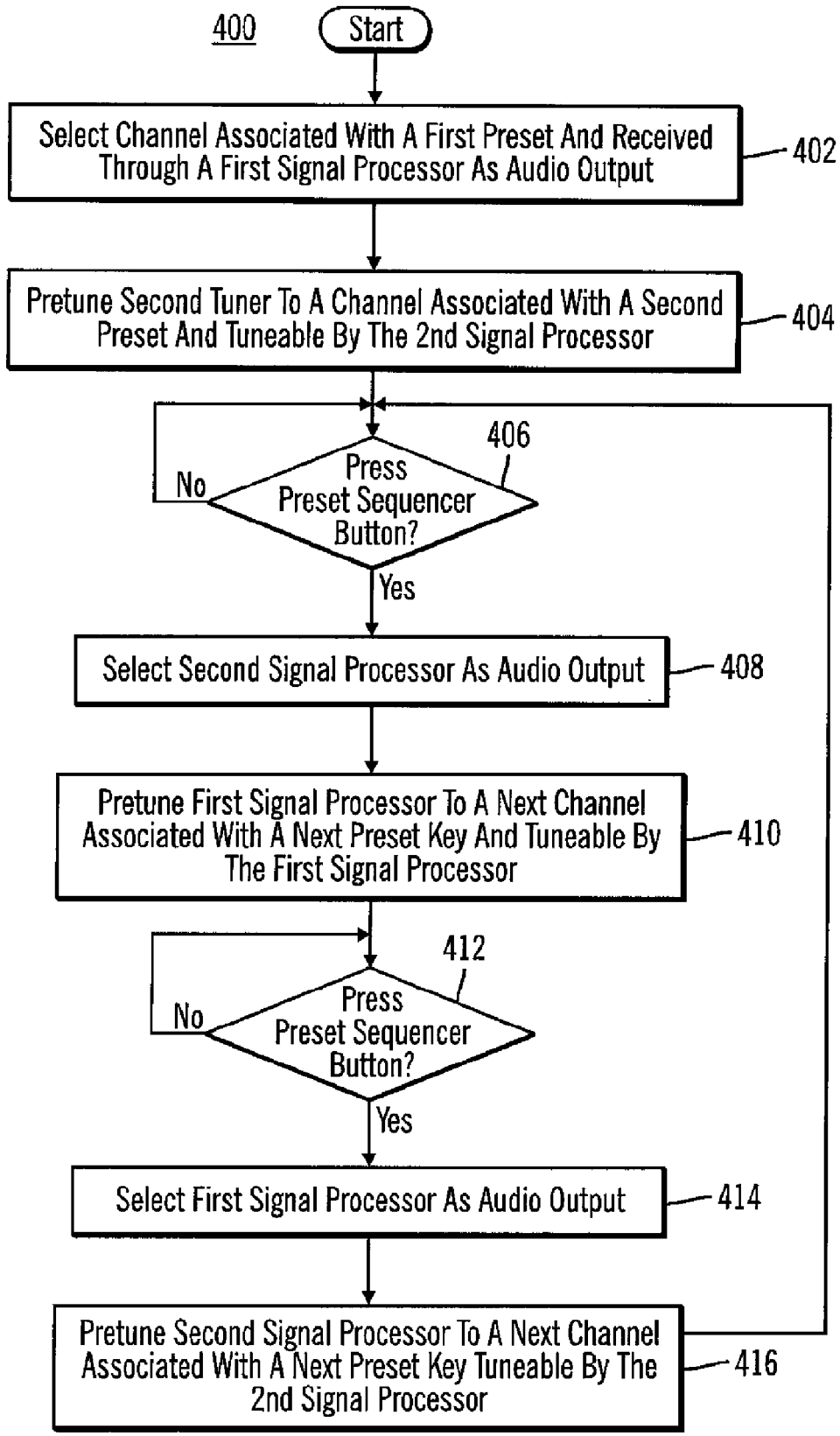
FIG. 4 illustrates a processing flow diagram a preset sequencer button operation in accordance with one embodiment of the present invention.

FIG. 4 illustrates a processing flow diagram for a preset sequencer button operation 400 in accordance with one embodiment of the present invention. The preset sequencer button operation 400 is performed in one embodiment by radios with two tuners and responds to presses of the preset sequencer button 120 to cause sequential selection of charmers that are assigned to preset keys within the bank of preset keys 104. In one embodiment, the channels are selected in the sequence determined by the sequence of preset keys within the bank of preset keys 104. In the situation where the preset keys were assigned by the automatic preset key assignment process 300, described above, the preset sequencer button operation 400 advantageously speeds sequential selection of channels by allowing pre-tuning of the other tuner to a next channel while producing audio output from one tuner corresponding to a current channel, thereby reducing a delay associated with subsequently selecting the second next channel in the preset sequence with the preset sequencer button.

The preset sequencer button operation 400 begins by selecting, at step 402, a channel associate with a first preset and received through a first signal processor as audio output. The processing continues with pre-tuning, at step 404, a second tuner to a channel associated with a second preset and tunable by the second signal processor. The processing then proceeds to determine, at step 406, if a preset sequencer button 120 pressed occurs. The processing continues this determination until the preset sequencer button 120 is pressed. When it is determined that a preset sequencer button 120 has been pressed, the processing continues by selecting, at step 408, the second signal processor as an audio output. One embodiment selects the second signal processor as an audio output by operation of the audio switch 114, discussed above.

The processing proceeds to pretuning, at step 410, the first signal processor to a next channel associated with a next preset key and that is tunable by the first signal processor. The processing then determines, at step 412, if the preset sequencer button 120 has been pressed. The processing continues to determine if the preset sequencer button 120 has been pressed until it is pressed. When the preset sequencer button 120 is determined to have been pressed, the processing continues by selecting, at step 414, the first signal processor as audio output. The processing continues by pretuning, at step 416, the second signal processor to a next channel associated with a next preset key tunable by the second signal processor. The processing then returns determining, at step 406, if the preset sequencer button 120 has been pressed.

It should be appreciated that if the next preset key in the sequence is available, it is skipped by the preset sequencer. Furthermore, if the next preset key has a channel assigned to the currently playing tuner, the audio output is not switched to the other signal processor. Rather the channel is simply changed on the currently selected signal processor to the channel assigned to the next preset key.

Thus it has been shown that embodiments of the present invention allow a user to directly assign channels to any chosen preset key by an elongated hold of the corresponding preset key. Advantageously, channels may also be automatically assigned to an available key by an elongated hold of the "0" key. These features allow the user to directly assign some preset keys while also relieving the user of any requirement to remember which preset keys are assigned and which are available for assignment.

An additional feature of the present invention determines if the currently selected channel is already assigned to a preset key within the preset bank of preset keys and allowing removal of that assignment from the corresponding key by an elongated hold of the "0" preset key. An icon indicates whether the currently tuned channel is assigned to a preset key in the bank. These features have the advantage of allowing the user to remove a channel from the preset bank without having to replace it with another channel.

A preset sequencer button allows the user to sequence through the presets. This relieves the user of the requirement to remember which preset key is associated with the next channel in the preset sequence.

In a two tuner radio, the non-select tuner is pre-tuned to the channel assigned to the next preset key in the sequence. Since the tuners receive signals from different networks, the automatic assignment of channels, by an elongated pressing of the "0" preset key, assigns channels of a particular tuner to alternating preset keys. In this way, sequencing through the channels assigned to the preset keys alternates between networks and therefore the tuners. Alternating between tuners allows taking advantage of being able to pre-tune the unused receiver to reduce or eliminate any undesirable gap in programming presented to the user due to changing channels. This automatic assignment of channels to preset keys further provides for direct assignment of channels to preset keys by elongated pressing of another preset key.

The present invention may also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least one computer readable medium that allows the computer to read data, instructions, messages or message packets, and other computer readable information. The computer readable medium may include non-volatile memory, such as ROM, Flash memory, Disk drive memory, CD-ROM, SIM card, and other permanent storage. Additionally, a computer medium may include, for example, volatile storage such as RAM, buffers, cache memory, and network circuits.

The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Reference throughout the specification to "one embodiment" means that a particular feature, structure, or characteristic described in connection with the embodiment is included in at least one embodiment of the present invention. Thus, the appearances of the phrases "in one embodiment" in various places throughout the specification are not necessarily all referring to the same embodiment. Furthermore, the particular features, structures, or characteristics may be combined in any suitable manner in one or more embodiments. Moreover these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

While the various embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A radio preset key assignment apparatus, comprising:
a channel selection processor, communicatively coupled to a plurality of preset keys, the channel selection processor adapted to assign each preset key of the plurality of preset keys to a respective assigned channel, each preset key within the plurality of preset keys being able to cause a radio to select a respective channel assigned to that preset key, the channel selection processor further adapted to determine a currently selected channel of the radio; and
a preset key assigner, communicatively coupled to a pre-defined preset key within the plurality of preset keys and communicatively coupled to the channel selection processor, the preset key assigner configured to determine a pressing and holding of the pre-defined preset key for at least a predetermined period of time and, in response thereto, assigning the currently selected channel to an available preset key that is different from the pre-defined preset key.

2. The preset key assignment apparatus of claim 1, wherein the preset key assigner further is adapted to assign, in response to determining that the currently, selected channel is not currently assigned to any of the plurality of preset keys, the currently selected channel to an available preset key that is different from the pre-defined preset key, and to de-assign, in response to determining the pressing of said pre-defined preset key and that the currently selected channel is currently assigned to any of the plurality of preset keys, the currently selected channel from the preset key to which the currently selected channel is currently assigned.

3. The preset key assignment apparatus of claim 1, wherein the preset key assigner is further adapted to assign, in response to determining the pressing and in response to determining that each of the plurality of the preset keys has an assigned respective channel, the currently selected channel to the pre-defined preset key.

4. The preset key assignment apparatus of claim 1, wherein the preset key assigner is further adapted to: determine an elongated pressing of a pressed preset key other than the pre-defined preset key within the plurality of preset keys; and assign, in response to determining the elongated pressing of the pressed preset key, the currently selected channel to the pressed preset key.

5. The preset key assignment apparatus of claim 4, wherein the preset key assigner determines the pressing of the pre-defined preset key by determining an elongated pressing of the pre-defined preset key, and wherein the channel selection processor is further adapted to: detect a short pressing of a pressed preset key within the plurality of preset keys; and cause, in response to detecting the short pressing, the radio to select a channel assigned to the pressed preset key.

6. The preset key assignment apparatus of claim 1, wherein the plurality of preset keys are arranged in a sequence, and wherein the pre-defined preset key is a preset key at one end of the sequence.

7. The preset key assignment apparatus of claim 1, wherein the plurality of preset keys are arranged in a sequence, and wherein the available preset key is one of a highest preset key in the sequence that has no assigned channel, and a lowest preset key in the sequence that has no assigned channel.

8. The preset key assignment apparatus of claim 1, wherein the plurality of preset keys are arranged in a sequence, wherein the radio comprises at least a first signal processor adapted to process first channels from a first set of radio signals and a second signal processor adapted to process second channels from a second set of radio signals that are different from the first set of radio signals, and wherein the currently selected channel is within the first channels processed by the first signal processor, and wherein the preset key assigner is further adapted to: determine that a candidate preset key exists, the candidate preset key being adjacent, in the sequence, to at least one preset key that is not assigned a channel within the first channels; and assign, in response to determining that the candidate preset key exists, the currently selected channel to the candidate preset key.

9. The preset key assignment apparatus of claim 8, wherein the plurality of preset keys are arranged in a sequence and the preset key assigner is further adapted to: assign, in response to determining that the candidate preset key does not exist, the currently tuned channel to one of a highest preset key in the sequence that has no assigned channel and a lowest preset key in the sequence that has no assigned channel.

10. The preset key assignment apparatus of claim 8, further comprising a preset sequencer adapted to:
cause, in response to a press of a preset sequencer button, one signal processor within the first signal processor or the second signal processor to select a next channel corresponding to a channel assigned to a next preset key in the sequence of the plurality of preset keys, the preset sequencer further adapted to cause, in response to the press of the preset sequencer button, another signal processor within the first signal processor or the second signal processors that is different from the one signal processor to pre-select a second next channel corresponding to a second channel assigned to a next subsequent preset key after the next preset key in the sequence of the plurality of preset keys, the second next channel being selectable by the another signal processor, thereby reducing a delay associated with subsequently selecting the second next channel in the preset sequence with the preset sequencer button.

11. The preset key assignment apparatus of claim 10, wherein the preset key assigner is responsive to an elongated press of the pre-defined preset key by assigning the currently selected channel to the available preset key that is different from the pre-defined preset key, and wherein the preset key assigner is further adapted to: determine an elongated pressing of a pressed preset key other than the pre-defined preset key within the plurality of preset keys;
assign, in response to determining the elongated pressing of the pressed preset key, the currently selected channel to the pressed preset key; detect a short pressing of any pressed preset key within the plurality of preset keys; and cause, in response to detecting the short pressing, the radio to select a channel assigned to the pressed preset key.

12. The preset key assignment apparatus of claim 11, wherein the preset key assigner is adapted to assign channels within the second channels to available preset keys that are not adjacent, in the sequence, to preset keys that are assigned channels in the second channels.

13. A method for assigning radio preset keys, the method comprising:
determining a currently selected channel of a radio;
determining a pressing of a pre-defined preset key, the pre-defined preset key being within a plurality of preset keys, each preset key within the plurality of preset keys being able to cause the radio to select a respective channel assigned to that preset key; and
in response to determining a pressing and holding of said pre-defined preset key for at least predetermined period of time and that the currently selected channel is not currently assigned to a preset key within the plurality of preset keys, assigning the currently selected channel to an available preset key that is different from the pre-defined preset key.

14. The method of claim 13, further comprising:
assigning, in response to determining that the currently selected channel is not currently assigned to any of the plurality of preset keys, the currently selected channel to an available preset key that is different from the pre-defined preset key; and
in response to the determining the pressing of said pre-defined preset key and that the currently selected channel is currently assigned to any of the plurality of preset keys, de-assigning the currently selected channel from the preset key to which the currently selected channel is currently assigned.

15. The method of claim 13, further comprising:
determining an elongated pressing of a pressed preset key other than the pre-defined preset key within the plurality of preset keys; and
assigning, in response to determining the elongated pressing of the pressed preset key, the currently selected channel to the pressed preset key.

16. The method of claim 13, wherein the plurality of preset keys are arranged in a sequence, wherein the radio comprises at least a first signal processor adapted to process first channels from a first set of radio signals and a second signal processor adapted to process second channels from a second set of radio signals that are different from the first set of radio signals, and wherein the currently selected channel is within the first channels processed by the first signal processor, and wherein the assigning the currently selected channel further comprises:
determining that a candidate preset key exists, the candidate preset key being adjacent, in the sequence, to at least one preset key that is not assigned a channel within the first channels, and
assigning, in response to determining that the candidate preset key exists, the currently selected channel to the candidate preset key.

17. The method of claim 16, wherein the assigning the currently selected channel comprises assigning channels within the second channels to available preset keys that are not adjacent, in the sequence, to preset keys that are assigned channels within the second channels.

18. The method of claim 16, further comprising:
causing, in response to a press of a preset sequencer button, one signal processor within the first signal processor or the second signal processor to select a next channel corresponding to a channel assigned to a next preset key in the sequence of the plurality of preset keys,
causing, in response to the press of the preset sequencer button, another signal processor within the first signal processor or the second signal processors that is different from the one signal processor to pre-select a second next channel corresponding to a second charmer assigned to a next subsequent preset key after the next preset key in the sequence of the plurality of preset keys, the second next channel being selectable by the another signal processor, thereby reducing a delay associated with subsequently selecting the second next channel in the preset sequence with the preset sequencer button.

19. The method of claim 18, wherein the determining a pressing of the pre-defined preset key comprises determining an elongated press of the pre-defined preset key, the method further comprising:
responding to an elongated press of the pre-defined preset key by assigning the currently selected channel to the available preset key that is different from the pre-defined preset key;
determining an elongated pressing of a pressed preset key other than the pre-defined preset key within the plurality of preset keys;
assigning, in response to determining the elongated pressing of the pressed preset key, the currently selected channel to the pressed preset key; detecting a short pressing of a pressed preset key within the plurality of preset keys; and
causing, in response to detecting the short pressing, the radio to select a channel assigned to the pressed preset key.

20. A radio preset key assignment apparatus, comprising:
a channel selection processor, communicatively coupled to a plurality of preset keys, wherein the plurality of preset keys are arranged in a sequence, and wherein a pre-defined preset key is assigned to a preset key at one end of the sequence, the channel selection processor configured to:
assign each preset key of the plurality of preset keys to a respective assigned channel, each preset key within the plurality of preset keys being able to cause the radio to select a respective channel assigned to that preset key, wherein the radio comprises at least a first signal processor adapted to process first channels from a first set of radio signals and a second signal processor adapted to process second channels from a second set of radio signals that are different from the first set of radio signals, and wherein the currently selected channel is within the first channels processed by the first received signal processor, and determine a currently selected channel of the radio;

a preset key assigner, communicatively coupled to the pre-defined preset key and communicatively coupled to the channel selection processor, the preset key assigner adapted to: determine a pressing of the pre-defined preset key and, in response thereto, assign, in response to determining that the currently selected channel is not currently assigned to a preset key, the currently selected channel to an available preset key that is different from the pre-defined preset key wherein the available preset key is one of a highest preset key in the sequence that has no assigned channel, and a lowest preset key in the sequence that has no assigned channel;

de-assign, in response to determining the pressing of said pre-defined preset key and that the currently selected channel is currently assigned to a preset key, the currently selected channel from the preset key to which the currently selected channel is currently assigned;

assign, in response to determining the pressing of said pre-defined preset key and that each of the plurality of the preset keys except for the pre-defined preset key is currently assigned to a respective channel, the currently selected channel to the pre-defined preset key;

determine that a candidate preset key exists, the candidate preset key being adjacent, in the sequence, to a preset key not assigned to a channel within the first channels;

assign, in response to determining that the candidate preset key exists, the currently tuned channel to the candidate preset key;

assign, in response to determining that the candidate preset key does not exist, the currently tuned channel to one of a highest preset key in the sequence that has no assigned channel and a lowest preset key in the sequence that has no assigned channel; and assign channels within the second channels to available preset keys that are not adjacent, in the sequence, to preset keys that are assigned channels in the second channels;

respond to an elongated press of the pre-defined preset key by assigning the currently selected channel to the available preset key that is different from the pre-defined preset key;

determine an elongated pressing of a pressed preset key other than the pre-defined preset key within the plurality of preset keys;

assign, in response to determining the elongated pressing of the pressed preset key, the currently selected channel to the pressed preset key;

detect a short pressing of any pressed preset key within the plurality of preset keys;

cause, in response to detecting the short pressing, the radio to select a channel assigned to the pressed preset key; and a preset sequencer adapted to:

cause, in response to a press of a preset sequencer button, one signal processor within the first signal processor or the second signal processor to select a next channel corresponding to a channel assigned to a next preset key in the sequence of the plurality of preset keys; and cause, in response to the press of the preset sequencer button, another signal processor within the first signal processor or the second signal processors that is different from the one signal processor to pre-select a second next channel corresponding to a second channel assigned to a next subsequent preset key after the next preset key in the sequence of the plurality of preset keys, the second next channel being selectable by the another signal processor, thereby reducing a delay associated with subsequently selecting the second next channel in the preset sequence with the preset sequencer button.

* * * * *